United States Patent [19]

Hunsperger et al.

[11] Patent Number: 4,773,074

[45] Date of Patent: Sep. 20, 1988

[54] DUAL MODE LASER/DETECTOR DIODE FOR OPTICAL FIBER TRANSMISSION LINES

[75] Inventors: Robert G. Hunsperger; Jung H. Park, both of Newark, Del.

[73] Assignee: University of Delaware, Newark, Del.

[21] Appl. No.: 9,863

[22] Filed: Feb. 2, 1987

[51] Int. Cl.[4] .................. H01S 3/19; H01L 31/12
[52] U.S. Cl. ............................. 372/50; 357/19
[58] Field of Search ............. 357/19, 17; 372/45, 372/46, 44, 50; 350/96.15

[56] References Cited

U.S. PATENT DOCUMENTS

| 3,952,265 | 4/1976 | Hunsperger | 357/19 |
| 4,202,000 | 5/1980 | Carballes | 357/19 |
| 4,440,470 | 4/1984 | Khoe | 357/17 |

FOREIGN PATENT DOCUMENTS 2437083  5/1980  France ........................ 372/45

OTHER PUBLICATIONS

Hunsperger, R. G., "Integrated Optics: Theory and Technology", 2nd Edition, Springer-Verlag, pp. 281 and 312.

Primary Examiner—James W. Davie
Assistant Examiner—Georgia Y. Epps
Attorney, Agent, or Firm—Connolly and Hutz

[57] ABSTRACT

The invention relates to an emitter-receiver semiconductor diode device for direct optical coupling to optical signal transmission apparatus. It is a unitary combination of a double heterostructure diode and a waveguide photodiode with elements to selectively switch between an emission mode and a receiving mode. Confining semiconductor at least partially restrict light to junction-forming active and waveguiding semiconductors of the diode.

12 Claims, 2 Drawing Sheets

DUAL MODE LASER/DETECTOR DIODE FOR OPTICAL FIBER TRANSMISSION LINES

FIELD OF THE INVENTION

The invention relates to semiconductor diode devices for direct optical coupling to optical fibers or other waveguides in optical signal transmission. In particular, the invention embraces a unitary combination of a double heterostructure diode (DH) for emission and that of a waveguide photodiode as a receiver, the combination being characterized by an interposed lightly doped waveguide element between a heavily doped active layer and a semiconductor confining element of the diode. The diode can be switched from the emitter mode to a receiver mode by application of a reverse-bias electric field instead of the forward bias field used for emission.

BACKGROUND

Practical transmission of signals by optical beams through thin transparent fibers rather than by electrical currents through electrically conductive wires or radio waves became a reality after the development in the early 1960's of the laser which provides a stable source of coherent light. The emergence of the concept of "integrated optics", wherein wires and radio links were replaced by optical fibers rather than through-the-air optical paths progressed further by development of miniaturized optical integrated circuits to replace conventional circuits. This major advance was enhanced by the creation of gallium aluminum arsenide (GaAlAs) diodes and photolithographic microfabrication technology capable of production ultraminiature devices with submicron line widths.

Advantages of the current state of optical fiber transmission lines over electrical counterparts include its stability, its wide bandwidth, its freedom from noise and external interference and its greater utility afforded by the small size of practical equipment. The last advantage is obtained by using miniature semiconductor lasers for introducing optical signals into an optical fiber and coupling photodiodes to the fiber for detection. Earlier systems, however, required bulky, vibration-sensitive combinations of mirrors, prisms, and gratings to direct an optical beam carrying a signal from the emitter (laser) to the appropriate photodiode detector. Although such apparatus was at least comparable to or better in the reliability than existing electrical means of signal transmisson, this and other difficulties have retarded acceptance of fiber-optic signal transmission.

One of the difficulties of earlier systems was the necessity for separate emitter and detector diodes to introduce the signal at one end of a fiber and to detect the signal at the other end of the fiber. This difficulty was significantly mitigated by Hunsperger in a system (U.S. Pat. No. 3,952,265, issued Apr. 20, 1976, to R. G. Hunsperger) which provides a unitary dual mode diode which can function as an emitter or detector. Basically, this dual mode diode is a p-n junction diode that functions as a laser when forward biased and as a photodiode when reverse biased, or with no voltage applied, the diode is in a neutral state with a relatively low insertion loss which does not interfere with the functioning of other devices on the transmission line.

The present invention recognized the severity of the problem of vibration sensitivity in coupling diodes to optical fibers and other waveguides, limiting the quality of transmission and performance of equipment. Further, mechanical instability of systems of mirrors, prisms, and gratings made installation in certain field applications, such as aircraft, awkward.

Accordingly, it is an object of the invention to provide diode devices for introducing optical signals into a fiber-optic line or other waveguide and receiving optical signals from fiber-optic lines or other waveguides, the device being substantially free of adjuncts with high sensitivity to mechanical disturbances and vibration.

It is another object of the invention to provide a p-n junction diode for direct coupling to a fiber-optic transmission line.

It is still another object of the invention to provide a unitary device capable of functioning as an emitter for introducing an optical signal into a fiber-optic transmission line and receiving an optical signal from a fiber-optic transmission line or other waveguide to which it can be coupled directly.

These and other objects will be apparent from the specification with accompanying drawings and claims.

SUMMARY OF THE INVENTION

The objects of the invention are accomplished by diode devices for coupling directly to fiber-optic transmission lines or other waveguides by an interposed low-loss waveguiding layer between the active layer and the confining layer of the diode.

In a preferred embodiment of the invention, the device is a unitary p-n junction diode for direct coupling to optical fiber transmission lines or other waveguides in which the diode is adapted to selectively function both as an emitter and receiver. In this embodiment, the active (light emitting) p-type semiconductor layer of the diode is highly doped to increase laser emission efficiency, while sensitivity as a receiver is increased by application of a reverse bias that is large enough to activate the Franz-Keldysh effect, while efficient direct coupling is provided by means of a low-loss lightly doped waveguide layer interposed between the active layer and a confining layer to increase the effective receiving area for incident light.

The diode of the preferred embodiment is a unitary combination of double heterostructure (DH) laser diode and waveguiding photodiode geometries having a low-loss waveguiding element interposed between its active layer and a confining layer.

The diode can be coupled to fibers either by direct butt-joint coupling or by using simple intermediate optics. It can be used as a discrete element or as a monolithic element of an optical integrated circuit. In discrete form, the diode of the invention can be connected in series as an element of an optical transmission line or to multiple circuits through a star coupler. As an element of an optical integrated circuit, the diode can be monolithically integrated into a waveguide of the circuit.

The dual mode laser/detector device of the invention can be fabricated using liquid phase epitaxy (LPE), molecular beam epitaxy (MBE) or by metal-organic chemical vapor deposition (MOCVD).

DESCRIPTION OF THE DRAWING

Understanding of the invention can be facilitated by reference to the drawings, not to scale, in which.

DESCRIPTION OF THE INVENTION

Figure 1:
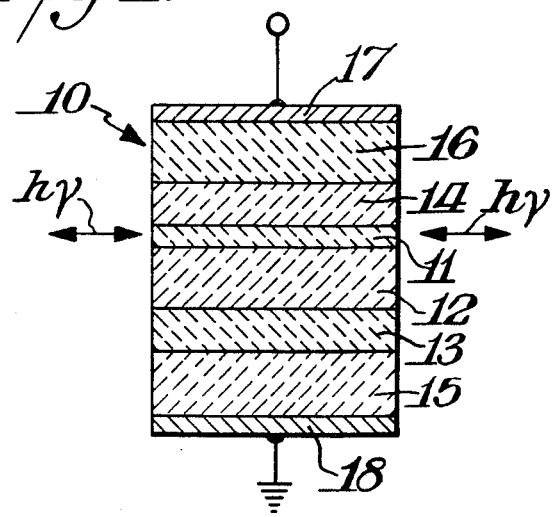
FIG. 1 schematically illustrates a layered structure embodiment of the dual mode laser-detector diode of the invention.

U.S. Pat. No. 3,952,265, issued Apr. 20, 1976, to Robert Hunsperger, mentioned earlier herein, is incorporated by reference as background teaching and for methods applicable to the instant invention.

In the instant invention, attention is directed to solving problems relating to direct coupling of laser and photoreceptor diodes to waveguides and fibers by taking advantage of the geometry of both waveguide photodiodes and double heterostructure (DH) laser diodes. In waveguide photodiodes, because all incident light signals are absorbed directly in the plane of the depletion layer, not only is the quantum efficiency high, but also the diffusion time delay of carriers is eliminated. Because the waveguide detector of the instant invention has a lightly doped waveguiding layer that is relatively thick compared to the junction depletion thickness of a conventional p-n diode, it has reduced junction capacitance resulting in good high frequency response. The double heterostructure, the most widely used structure for semiconductor lasers, with a low threshold current density and high efficiency resulting from carrier and photon confinement, provides good emission properties to the unitary combination.

In the present invention, three factors having internally competitive behavior which affect the use of DH laser diodes as waveguide photodetectors have been identified and resolved:

First, in a DH laser, the absorption loss coefficient must be small to lower the threshold current density and to increase efficiency, while in a waveguide photodiode, however, a large absorption coefficient, $\alpha$, is essential for high quantum efficiency and sensitivity.

The second factor involves competition between the optimum structure for lasers and the optimum structure for photodiodes, related to the dimensions of the depletion layer. To get a population inversion in the active region with low series resistance, layers of a DH laser are heavily doped, typically at a concentration of around $10^{18}$ cm$^{-3}$. The maximum depletion layer thickness for this doping concentration is only 0.08 micrometer ($\mu$m). This depletion layer thickness is about one fiftieth that of a conventional photodiode. However, such an extremely thin layer increases junction capacitance to 50 times that of a conventional photodiode so that high frequency response is severely limited by the high R-C time constant. Further, it is very difficult to couple all of the incident light into an extremely thin depletion layer. If the incident light is not confined in the depletion region, not only would the quantum efficiency be reduced, but also time delay associated with carrier diffusion would further reduce response speed.

The third factor in internal competitive effects arises from device length. For high efficiency, the DH laser must not be too long. On the other hand, a waveguide photodiode requires a large product of the absorption coefficient and the device length for high quantum efficiency. Should there be a means to increase the absorption coefficient dramatically, the device length would no longer be a problem.

The present invention has provided trade-off in the foregoing factors and thus enabled construction of a direct-coupled, dual diode of high optical output and the capability of emitting high-intensity signals without the risk of catastrophic failure.

As a trade-off and a solution to the first and third of the foregoing factors, the Franz-Keldysh effect is used to change the absorption coefficient electrically, as described in the Hunsperger patent, noted above. (For a detailed background, see "Integrated Optics: Theory and Technology," Hunsperger, R. G., Springer-Verlag, Berlin, Heidelberg, N.Y., 1982, especially page 260 et seq.) For n type GaAs an experimental value of $\alpha = 100$ cm$^{-1}$ (i.e., almost total absorption) results from an applied field of $4 \times 10^4$ V/cm, which corresponds to 4.0 V reverse bias across a depletion width of 1.0 $\mu$m. Therefore, to absorb 97% of the incident light, the diode needs only 350 $\mu$m length, which is the typical length of a laser diode. Thus, it can be seen that the diode can be electrically switched from a low absorption state for laser operation to high absorption state for detection, by means of a reasonably small bias voltage.

The second of the foregoing factors is the problem of getting a sufficiently thick depletion layer without diminishing laser efficiency. This problem is solved by the present invention by both waveguide photodiode and DH laser diode geometries including a lightly doped, low loss waveguiding layer, upon which incident light enters, between the active layer and one of the confining layers.

Reference to FIG. 1 will facilitate understanding the basic structure of the invention. Shown in the drawing, not to scale, is a cross-sectional view of diode 10 with heavily doped active layer 11 of p-type gallium arsenide (GaAs). Waveguiding layer 12 is lightly doped n-type GaAs, with a doping concentration of $5 \times 10^{15}$ to $3 \times 10^{16}$ cm$^{-3}$. The thickness of the waveguiding layer is slightly less than the maximum depletion layer width at breakdown i.e., less than 1.0 to 5.0 $\mu$m. The doping concentration of the active layer is about $10^{18}$ cm$^{-3}$ or higher with a thickness of 0.5 $\mu$m or less.

Continuing in reference to FIG. 1, confining layer 13 of gallium aluminum arsenide (GaAlAs) is doped for n-type conductivity while confining layer 14 also GaAlAs is doped as p-type, while substrate 15 is n-type GaAs and cap 16 is p-type GaAs. Electrode 17 and ground contact 18 provides means for application of the Franz-Keldysh reverse bias voltage in selection of the mode of operation of the diode as a detector or application of forward bias voltage for operation as an emitter. When the diode is reverse biased for the detecting mode of operation, the lightly doped waveguiding layer will be mostly depleted and act as a $P^{30}$-n waveguide photodiode, exhibiting the Franz-Keldysh effect.

For a waveguiding layer having a doping concentration of $n = 2 \times 10^{16}$ cm$^{-3}$ and a thickness of 1.5 $\mu$m, the maximum depletion layer width is 1.8 $\mu$m for a breakdown reverse bias field of $4.8 \times 10^5$ V/cm, which corresponds to about 86.4 volts bias across the p-n junction. Due to the Franz-Keldysh effect, the absorption coefficient, $\alpha$, can be increased from 25 to $10^4$ cm$^{-1}$ by applying a reverse bias field of $1.35 \times 10^5$ V/cm, which corresponds to 20.2 volts reverse bias across a resulting depletion width of 1.5 $\mu$m. Therefore, 99% of the incident photons will be abosrbed within 9 $\mu$m. In addition to a high quantum efficiency, a high speed response of the detector can be expected because of reduced capacitance and the high electron mobility of lightly doped GaAs, as well as elimination of the time delay associated with the diffusion of carriers and the possibility of using small-area stripe geometry.

When the diode is forward biased for the lasing mode of operation, injected electrons and holes are confined in the active layer, and generated photons are confined in the waveguiding layer and the active layer. If the radiation is distributed uniformly in both layers, the effective absorption coefficient, $\alpha$, is given by $$\alpha = \frac{d_1}{d_1 + d_2} \alpha_1 + \frac{d_2}{d_1 + d_2} \alpha_2$$

where $d_1$ and $d_2$ are thicknesses of the active layer and the waveguiding layer respectively, and $\alpha_1$ and $\alpha_2$ are the absorption coefficients of the active layer and waveguiding layer, respectively. The coefficient $\alpha_1$ depends upon the hole concentration and the injected electron density, and is about 30 cm$^{-1}$ according to the literature, if scattering losses are negligible. The coefficient $\alpha_2$ depends upon the free electron concentration in the waveguiding layer because the lasing photon energy of the higly doped p-type active layer is substantially (30–50 meV) below the absorption edge of the lightly doped n-type layer. Therefore, a reasonable estimate of $\alpha_2$ is 6 cm$^{-1}$. The calculated effective absorption coefficient is from 8 cm$^{-1}$ for $d_2 = 5$ m to 14 cm$^{-1}$ for $d_2 = 1$ $\mu$m.

When the diode is in the neutral state, there are no injected carriers in the waveguiding layer and $\alpha_2$ becomes less than 6 cm$^{-1}$. This means that the waveguiding layer is almost transparent to the operating wavelength. Since the dual mode diode has a low absorption coefficient, a low insertion loss is expected when the device is very effectively connected in series in a fiber-optic communication system.

The threshold current density, $J_{th}$, and overall power efficiency $\eta_{tot}$, will be similar to the large optical cavity (LOC) laser which has separate confinement of photons and carriers. Threshold current density ($J_{th}$) ranges from 2000 to 8000 A/cm$^2$ for active layer thicknesses ($d_2$) from 1.0 to 5.0 $\mu$m, respectively. Those values are slightly higher than a typical $J_{th}$ of a DH laser as a result of the added waveguiding layer. The waveguiding layer can be thicker than 5.0 $\mu$m with a doping concentration less than $5 \times 10^{15}$ cm$^{-3}$ at the expense of a considerably higher threshold current density ($J_{th}$). Also, excessively large active layer thicknesses can lead to increased carrier drift time and limit the high frequency response of the laser. The efficiency of the diode of this invention is typical of that of a DH laser, $\eta_{tot} \approx 40\%$. Therefore, it can be seen that the added waveguiding layer slightly increases, $J_{th}$, but does not significantly affect the efficiency of the laser.

An advantage of the diode of the invention compared to a conventional DH laser is the high optical output power capability of the diode due to the added waveguiding layer. The high optical flux density in the DH laser with a very thin active layer leads to catastrophic failure by mechanical mirror damage at relatively low peak power, which limits optical output power. This limitation is avoided in the new diode by having the optical field distributed over a large waveguiding layer, permitting high optical power operation without failures from this cause.

As was seen in the foregoing, a DH laser with a lightly doped waveguiding layer can be used as a high power light source with a reasonable $J_{th}$ and efficiency when forward biased. When this diode is reverse biased with an appropriate electric field, high quantum efficiency and high response speed of the detector result in part from the narrow channel waveguide geometry. It is important to observe that waveguiding depends upon a difference in the index of refraction between the waveguiding layer and the adjacent layers, the active layer and the confining layers. The dual mode laser/detector diode is effectively fabricated by using liquid phase epitaxy (LPE), molecular beam epitaxy (MBE) or the metal-organic chemical deposition (MOCVD) method as in fabrication of conventional diodes. The dual mode diode of the present invention has a narrow stripe of 5 to 25 $\mu$m width for a low threshold current ($J_{th}$) and a small junction capacitance. The devices are mounted on a gold-plated copper heat sink for continuous-wave (cw) operation.

Figure 2:
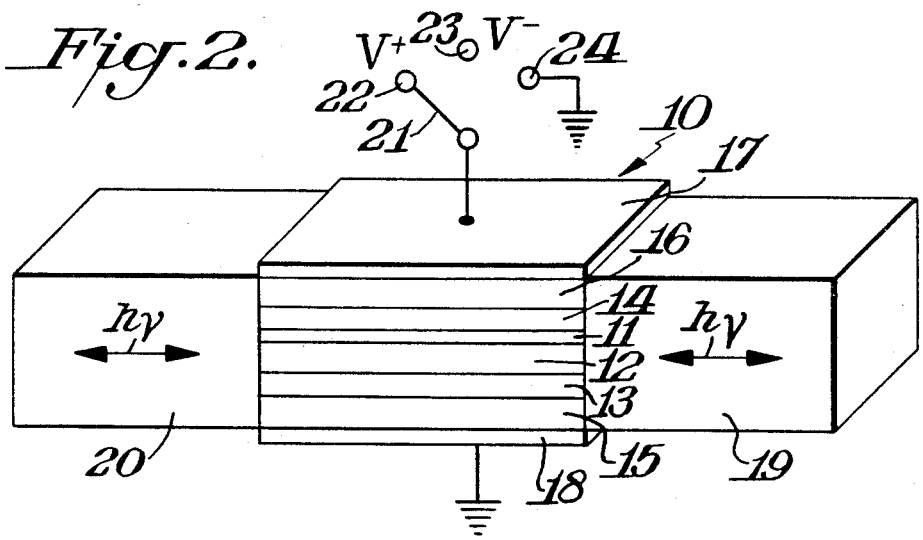
FIG. 2 illustrates the diode directly coupled to an optical waveguide of an optical integrated circuit.

As noted hereinbefore, the dual mode diode can be used either as a discrete element or as a monolithic optical integrated circuit element. The latter employment is illustrated schematically in FIG. 2 wherein numerals designate corresponding parts as in FIG. 1. Referring to FIG. 2, diode 10 the respective layers 11 to 16 and contacts 17 and 18 are as shown in FIG. 1, additionally showing directly-coupled optical waveguide element 19 of an integrated optical circuit, of which similar optical waveguide 20 forms a continuing part. Also shown is switch 21 to provide a forward bias by pole 22, or reverse bias by pole 23 in accordance with the intended use of the diode as an emitter or receiver, respectively. With no bias, provided by pole 24 as stated hereinbefore, the diode is neutral so that optical signals pass through from optical waveguide element 19 to the corresponding element 20 of the optical integrated circuit.

In operation, referring to FIG. 2, with an appropriate forward bias voltage applied through switch 21 in position 22, diode 10 acts as an emitter (laser) so that light emerges and enters the waveguide directly as shown by double-ended arrows h$\nu$. With reverse bias switch 21 in position 23 diode 10 acts as a receiver or detector so that light from other elements in the circuit, as indicated by either of double-ended arrows h$\nu$, enters and is detected to be converted to an electrical signal to be fed to electrical utilization elements. With switch in position 24 (ground) diode is neutral so that signal passes through substantially unaltered from element 19 to 20 or conversely.

Figure 3:
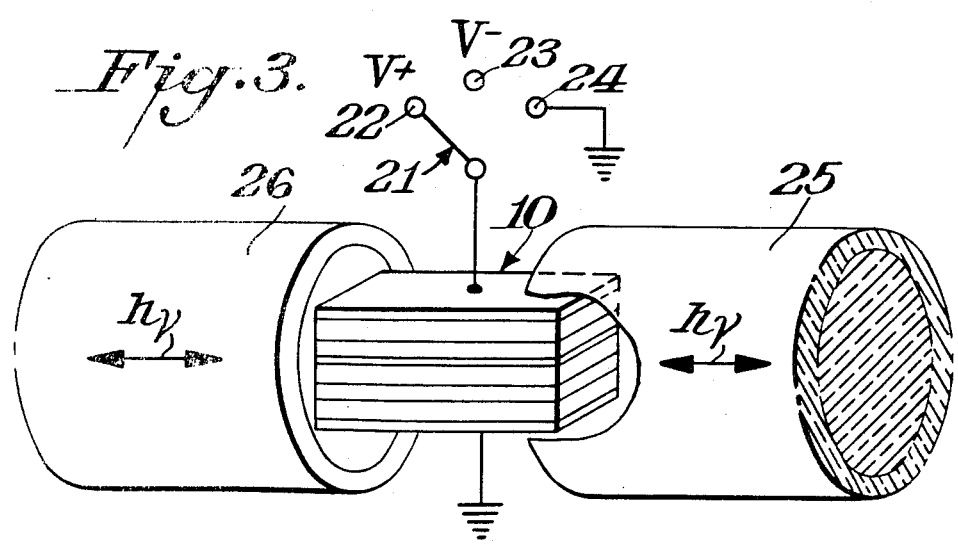
FIG. 3 illustrates the diode in a fiber-optic circuit.

FIG. 3 illustrates diode 10 directly coupled to optical fibers 25 and 26, with behavior similar to that with waveguide 19 and 20.

As described, the dual mode device can be used either as a discrete element or as a monolithic optical integrated circuit element. In monolithic form, it can be combined with other devices on the same chip to perform its function more effectively. For example, a metal-semiconductor field effect transistor (MESFET) and a dual mode diode can be formed on the same n-GaAs layer. Thus, a MESFET can be used to modulate the laser when forward biased by applying a signal to the gate electrode, and when the device is reverse biased, the signal can be amplified by the MESFET. This combination of a laser/detector diode with a laser-driver/amplifier FET is usable at high frequencies. In discrete form, as described in Hunsperger in U.S. Pat. No.

3,952,265, dual mode devices can be either connected in series by a waveguide or a fiber, or connected to each other through a star coupler.

Figure 4A:
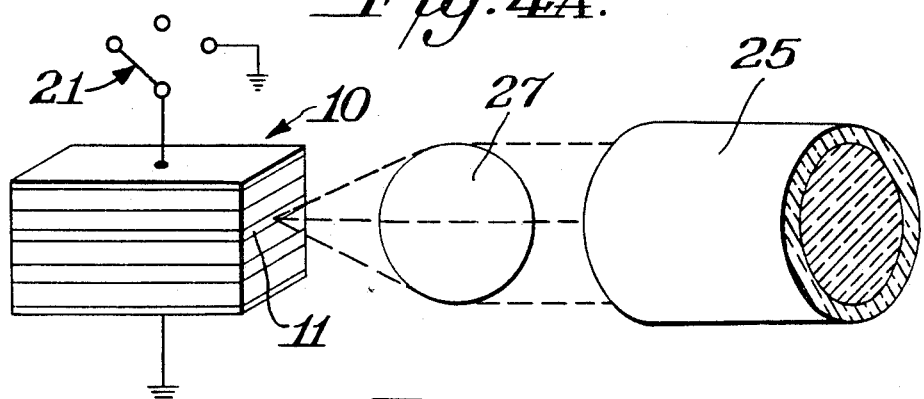
FIG. 4 illustrates the employment of microlenses to improve coupling an optical fiber to the active area of the diode.
Figure 4B:
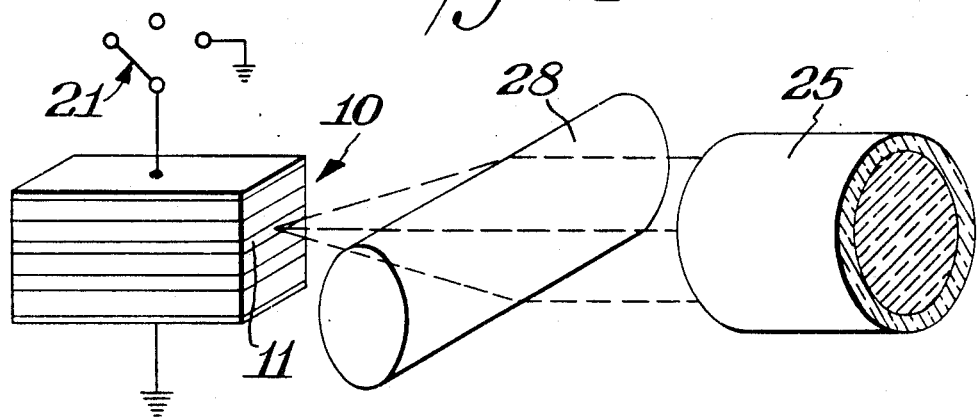

Coupling the device of this invention, as mentioned in the foregoing, can be either direct butt-joint coupling or by using intermediate optics. One of the simpler coupling schemes is to place the ends of the waveguide or fiber close to the active area of the diode. Diode-to-fiber coupling efficiencies near 30% are typically obtained by this direct butt coupling. However, the fiber-to-diode coupling efficiency is usually difficult because of the large area mismatch between the active area of the diode and the core area of the fiber if a multimode fiber is used. Spherical or cylindrical microlenses cemented between the end of a fiber and the diode improve the fiber-to-diode coupling efficiency by focusing the light from the fiber onto the active area of the dual mode diode, as shown in FIG. 4(a) and (b). In FIG. 4(a) spherical lens 27 focuses light from the fiber 25 on the active area of diode 10 while in FIG. 4(b) it is focused by cylindrical lens 28 when the diode functions as a receiver. Similarly, when the diode is in the emitter mode, since the output angle of the laser is greater than the fiber acceptance angle, using a microlens can also improve the diode-to-fiber efficiency.

Figure 5:
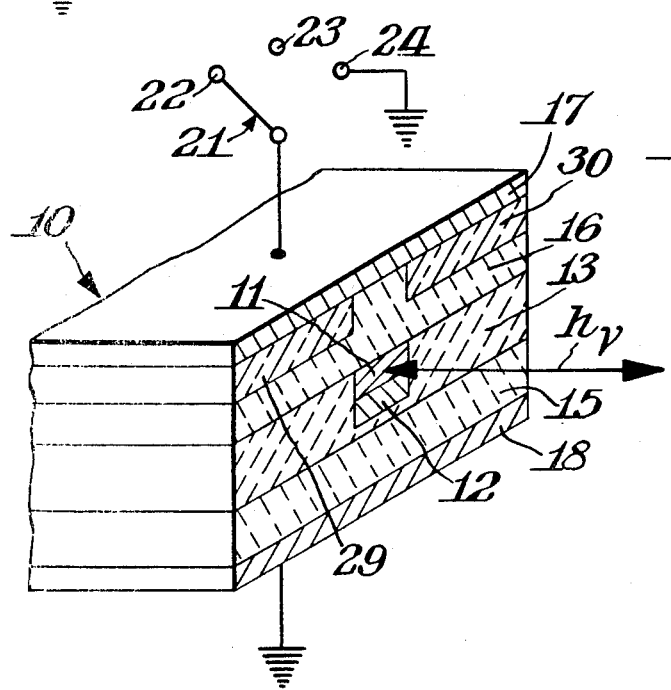
FIG. 5 illustrates a stripe-geometry configuration of the diode of the invention.

In FIG. 1 to FIG. 4, the emitter/detector (for use with an applied Franz-Keldysh bias to control its functional mode) is shown as a device having light confinement only in the vertical direction (i.e., parallel to the direction of current flow). FIG. 5 illustrates another embodiment, a device which is fabricated in a stripe configuration wherein the p-type active element and the n-type waveguiding element are in the form of a narrow, longitudinally extended stripe. Since these two elements form the active p-n junction, they are preferably coextensive. This configuration results confinement of the light in the lateral direction (i.e., transverse to the direction of current flow), which further facilitates coupling to a small size optical fiber core or to other optical waveguides. The stripe-geometry of the embodiment selectively functions in the emitter mode, as with the reverse Franz-Keldysh bias voltage for reception or forward bias voltage for emission.

The device of the embodiment shown in FIG. 5 can be fabricated by standard masked epitaxial growth procedures to provide active regions of p-type GaAs completely surrounded by light-confining regions of n-type $Ga_{(1-x)}Al_xAs$. This configuration can also be fabricated with other light-emitting semiconductors, such as a $Ga_{(1-x)}In_xAs_yP_{(1-y)}$ composition.

In the embodiment of FIG. 5, the various elements are illustrated (partly in section) corresponding to the other figures, like numerals indicating like parts, although some are of a different configuration. Active layer 11 p-type gallium arsenide (GaAs) is shown as a stripe buried in layers 13 of the opposite conductivity type, GaAlAs. Junction forming waveguiding stripe 12 is similarly buried with only the longitudinal ends of stripes 11 and 12 exposed. Semiconductor cap layer 16 covers the top side of stripe 11 while confining layer 13 extends beneath stripe 12. The narrow stripe configuration of the stripes in FIG. 5 efficiently limits the light for emission or light received to a narrow portion of the diode and facilitates direct coupling to other elements of an optical transmissions line. Also shown in FIG. 5 are metal contacts 17 and 18 as in FIG. 1; oxide insulating layers 29 and 30 serve to limit the spread of current over a wide area in the short pathway.

The significance of the high efficiency coupling of the invention can be appreciated by comparison of the physical dimensions of elements of the diode of the instant invention with those of conventional diodes employed in fiber-optic microelectronics. In general, optical fibers have a light transmitting core with a minimum of about 10 $\mu$m diameter, while conventional diodes have an active layer thickness of only the order of 0.1 $\mu$m thickness. In the emission mode, this is of no great concern, for as the light emerges from the lasing diode and spreads out, it can be generally incident on and enter the fiber, which has the greater cross section. In the detecting mode, however, much light emerging from the larger cross section of the fiber end would not enter the thin active layer. With the diode of the instant invention, as a result of the waveguiding layer, the waveguiding layer upon reverse Franz-Keldysh biasing becomes part of the active receiving area comparable in cross section to that of the fiber. Accordingly, the better cross-sectional match provides low-loss adaptability to direct coupling.

A further significant feature of the instant invention is its good high frequency response as an emitter while having a large cross section as a detector. As an emitter it can function with a very thin active layer, for high efficiency, because of the light-confining layers. However, as a result of the adjacent lightly doped waveguiding layer which comes into play in the detector mode, a large effective detector cross-section can be provided.

We claim:

1. A unitary emitter-receiver semiconductor diode device with the capability of direct optical coupling to optical transmission lines, the device having means for coupling to electrical forward bias and electrical reverse bias for selection between an optical emitter mode and an optical receiver mode, and contact means for coupling to external electrical circuits, the improvement comprising:
   a unitary combination of a double heterostructure diode having optical and carrier confinement and a waveguide photodiode;
   a p-n junction in said combination formed between a heavily doped active layer of one conductivity type and a lightly doped waveguiding layer of a conductivity type opposite that of the active layer to increase the efficiency in emitter mode and receiver modes, respectively.

2. The device of claim 1 in which semiconductor active layer and waveguiding layers with surfaces forming a p-n junction are of planar configuration, each having a surface opposite the junction-forming surfaces each in which opposite surface is contacted by a substantially planar confinement layer of a conductivity type the same as the semiconductor layer which they respectively contact.

3. The device of claim 1 which is of a stripe configuration having a junction formed by a heavily-doped, p-type semiconductor active planar stripe, and one surface of a lightly-doped, n-type semiconductor waveguiding planar stripe, each of said layers having surfaces opposite the junction surface and having a confining semiconductor layer contacting the edges of each stripe and the surface opposite the junction-forming surface of the waveguiding stripe.

4. The device of claim 1 in which the active and waveguiding layers are of a stripe configuration having a narrow, longitudinally extended, highly-doped p-type semiconductor active stripe, said stripe having opposed surfaces, lateral edges and longitudinal ends, one of said opposed surfaces forming a junction with a surface of a coextensive lightly-doped n-type semiconductor waveguiding stripe of a configuration similar to the active stripe, the active stripe having on the surface opposite the junction-forming surface a contacting semiconductor confining layer, said active stripe having on the two lateral edges a contacting semiconductor confining layer, said confining layer contacting lateral edges and at the surface opposite the junction-forming surface of the waveguiding stripe, whereby in operation light entrance and emergence are substantially restricted to the junction-forming stripe except at their longitudinal ends.

5. The device of claim 2 wherein the active layer is high-doped p-type gallium arsenide having a doping concentration of at least $5 \times 10^{17}$ cm$^{-3}$ and the waveguiding layer is lightly-doped n-type gallium arsenide having a doping concentration equal to or less than $5 \times 10^{15}$ cm$^{-3}$.

6. The device of claim 4 wherein the active stripe is highly-doped p-type gallium arsenide having a doping concentration of at least $5 \times 10^{17}$ cm$^{-3}$ and the waveguiding stripe is lightly-doped n-type gallium arsenide having a doping concentration equal to or less than $5 \times 10^{15}$ cm$^{-3}$.

7. The device of claim 1 having means for direct optical coupling to optical signal transmitting means.

8. The device of claim 7 wherein the means for direct optical coupling comprises a microlens.

9. The device of claim 8 wherein the microlens is a cylindrical lens.

10. The device of claim 8 wherein the microlens is a spherical lens.

11. The device of claim 4 wherein the semiconductor cap layer has an oxide layer on each lateral surface between it and electrical contact means to partially limit electric currents in the device to a narrow pathway substantially coextensive with the active stripe.

12. A unitary emitter-receiver semiconductor diode device for direct coupling to the fiber optical transmission lines, said device being a unitary combination of a double heterostructure diode and a waveguide photodiode of a multiplicity of functional semiconductor layers comprising:

a highly doped active layer having a doping concentration of at least $5 \times 10^{17}$ cm$^{-3}$ of a selected conductivity type, the layer having first and second surfaces;

a confining layer of the selected conductivity type with one surface in contact with the first surface of the active layer;

a highly doped waveguide layer having a doping concentration of less that $5 \times 10^{15}$ cm$^{-3}$ cm of the conductivity type opposite the selected conductivity type of the active layer, the waveguide layer having first and second surfaces, the first surface in contact with the second surface of the active layer;

a confining layer having a conductivity layer opposite the active layer type and having a surface in contact with the second surface of the waveguide layer;

cap and substrate layers; and means to couple the cell and optical and electrical circuits.

* * * * *